United States Patent [19]
Capps, Jr. et al.

[11] Patent Number: 5,867,037
[45] Date of Patent: Feb. 2, 1999

[54] METHOD AND APPARATUS OF PROGRAMMING FPGA DEVICES THROUGH ASIC DEVICES

[75] Inventors: Louis Bennie Capps, Jr., Round Rock; Richard Nicholas Iachetta, Jr., Pflugerville; An Xuan Tra, Round Rock, all of Tex.

[73] Assignee: International Business Machines Corporation, Armonk, N.Y.

[21] Appl. No.: 736,303

[22] Filed: Oct. 24, 1996

[51] Int. Cl.⁶ .............................................. H03K 19/173
[52] U.S. Cl. ............................ 326/38; 326/39; 364/489
[58] Field of Search ................ 326/38–39; 364/489–490

[56] References Cited

U.S. PATENT DOCUMENTS

| | | | |
|---|---|---|---|
| 4,870,302 | 9/1989 | Freeman | 326/41 |
| 5,051,622 | 9/1991 | Pleva | 326/38 |
| 5,122,685 | 6/1992 | Chan et al. | |
| 5,339,262 | 8/1994 | Rostok eret al. | 364/578 |
| 5,412,260 | 5/1995 | Tsui et al. | 326/38 |
| 5,432,708 | 7/1995 | Mohsen | 364/490 |
| 5,475,583 | 12/1995 | Bock et al. | 364/141 |
| 5,497,498 | 3/1996 | Taylor | 395/800 |
| 5,534,793 | 7/1996 | Nasserbakht | 326/44 |
| 5,696,454 | 12/1997 | Trimberger | 326/38 |
| 5,745,734 | 4/1998 | Craft et al. | 395/500 |

*Primary Examiner*—Jon Santamauro
*Attorney, Agent, or Firm*—Volel Emile

[57] ABSTRACT

A method and apparatus for receiving and transmitting programming data through an application specific integrated circuit is provided. In a first embodiment, the application specific integrated circuit comprises a main circuit, at least two input/output (I/O) mechanisms connected to the main circuit for transferring data into and out of the main circuit and a mechanism for receiving and transmitting the programming data. The mechanism for transmitting the programming data includes a tri-state buffer that is activated by a programming enable signal. In a second embodiment, the input and output of the buffer are multiplexed with the two I/O mechanisms connected to the main circuit.

4 Claims, 3 Drawing Sheets

METHOD AND APPARATUS OF PROGRAMMING FPGA DEVICES THROUGH ASIC DEVICES

BACKGROUND OF THE INVENTION

1. Field of the Invention

The present invention relates generally to programming field programmable gate array (FPGA) devices and, more particularly, to the ability of programming FPGA devices through application specific integrated circuit (ASIC) devices.

2. Description of the Related Art

Often times during the production of electronic systems, design errors may be uncovered or specifications and/or requirements changed. To allow for easy changes when any one of the above occurs, hardware designers have been modeling these systems using FPGA devices. FPGA devices are programmable devices. Hence, they can be re-programmed as often as needed to adjust to any new specifications or requirements as well as to correct any design errors.

FIG. 1 depicts an electronic system modeled with FPGA devices. Each FPGA device may be modeling a different part of the electronic system. For example, device 100 may be modeling a processor, device 110 may be modeling a memory controller, device 120 a cache controller etc. The devices are interconnected in a daisy chain fashion using an in-system-programming (ISP) bus 160 whereby a programming apparatus can be used to program more than one device. Each device has a serial data in (SDI) pin and a serial data out (SDO) pin. The SDI pin of device 100 is connected to the connector of the programming apparatus (not shown) and its SDO pin is connected to the SDI pin of device 110. The SDO pin of device 110 is connected to the SDI pin of device 120 and the SDO pin of device 120 is connected to the SDI pin of device 130 and so on. The SDO pin of the last device (i.e., device 150) is connected to the connector of the programming apparatus. In this manner, the programming apparatus, using an appropriate protocol, can program any one of the FPGA devices.

During the production of the electronic system, some of the FPGA devices may be replaced by ASIC devices. Whether or not an FPGA device is actually replaced by an ASIC device is usually governed by cost and availability of resources. For example, an FPGA device on the average costs approximately twelve (12) dollars to manufacture whereas the price of an ASIC device is around three (3) dollars. However, depending on the complexity of an ASIC device, the design of the ASIC device may take several thousands dollars in man-hours. Thus, the design cost of an ASIC design must be taken into consideration when making a decision to replace an FPGA device with an ASIC device.

In any event, ASIC devices are application specific devices and, thus, are not programmable. Consequently, ASIC devices are not equipped with programming interfaces nor do they contain SDI and SDO pins. Although devoid of programming interfaces, however, ASIC devices must be able to relay programming information to the FPGA devices located downstream in the chain. Otherwise, the programming chain is broken isolating the downstream FPGA devices from programming accessibility.

The conventional method of relaying programming information to downstream FPGA devices has been to bypass the ASIC devices. FIG. 2 depicts an electronic system modeled with both FPGA and ASIC devices. In FIG. 2, FPGA devices 110 and 150 of FIG. 1 are replaced by ASIC devices 170 and 180, respectively. Resistor $R_1$ connects the SDO pin of FPGA device 100 to the SDI pin of FPGA device 120. Thus, programming information, in essence, bypasses ASIC device 170 to reach FPGA device 130. Resistor $R_2$ functions in a similar fashion.

In order to be able to add these resistors to the circuit board, the board onto which the devices are mounted must have been designed with resistor pads at proper locations. That is, all the FPGA devices that would later be replaced by ASIC devices must have been pre-identified, a task that may not be feasible. In the alternative, resistor pads must be added at all locations where devices will be attached to the board. As a result, the board may become quite crowded.

When resistors are used to bypass the ASIC devices, the resistor pads must be populated with resistors for ASIC devices and left empty for FPGA devices. This adds complexity to the manufacturing process of the electronic systems, especially, when multiple FPGA devices are to be replaced by ASIC devices at different times. It also makes it very difficult to use ASIC and FPGA devices interchangeably as second sources to each other or as backup supplies as resistor pads will have to be populated or left empty depending on which of the two devices is used. When multiple FPGA devices are replaced with ASIC devices, the large number of permutations on the bill of materials (i.e., the list of parts that will be used) becomes hard to manage at manufacture time.

Consequently, there is a need in the art for an apparatus and method that allow downstream FPGA devices to be programmed through upstream ASIC devices without using resistors to bypass the ASIC devices.

SUMMARY OF THE INVENTION

The need in the art is addressed by the present invention. The present invention provides a method and apparatus for receiving and transmitting programming data through an ASIC device. In one embodiment of the invention, the ASIC device comprises a main circuit, at least two input/output (I/O) mechanisms connected to the main circuit for transferring data into and out of the main circuit and a mechanism for receiving and transmitting the programming data. The mechanism for transmitting the programming data includes a tri-state buffer that is activated by a programming enable signal.

In another embodiment, the mechanisms for transmitting and receiving the programming data are multiplexed with the two I/O mechanisms of the main circuit.

DESCRIPTION OF THE INVENTION

Figure 3:
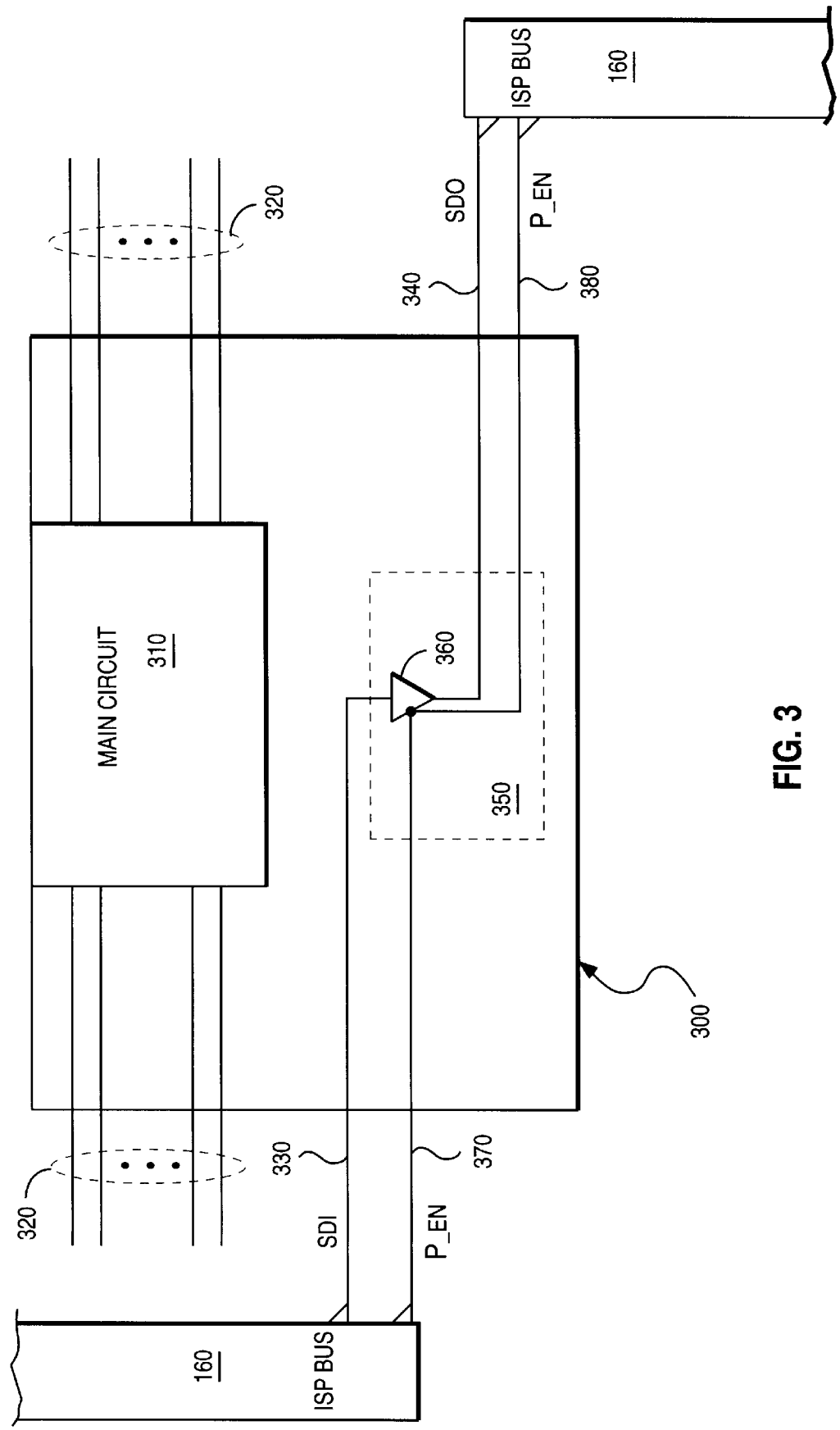
FIG. 3 illustrates an ASIC device incorporating the present invention.

FIG. 3 illustrates an ASIC device incorporating the present invention. ASIC device 300 comprises a main circuit 310 and standard I/O data pins 320. The ASIC device 300 also contains pseudo programming interface (PPI) 350. The PPI 350 comprises a tri-state driver (or buffer) 360 to temporarily hold the programming data. The input of the buffer 360 is connected to a pin 330 to receive programming data from an upstream device on the ISP bus 160. The output of the buffer 360 is connected to a pin 340 to pass the programming data to the next device in the chain. The buffer 360 also receives a programming enable signal, P_en, on pin 370. This programming signal is transferred to the next device on pin 380. The P_en signal is a signal used to place FPGA devices in programming mode.

In operation, when the programming apparatus needs to program an FPGA device, it sends the P_en signal in order to put the device in the programming mode. This is usually accomplished by asserting the signal received on pin 370. This signal will remain asserted until the programming data is received and the targeted FPGA device programmed. The present invention uses the P_en signal to activate the buffer 360. As long as the buffer 360 is activated, programming data received on pin 330 is transferred to pin 340. Once the P_en signal is deasserted, the buffer 360 becomes deactivated and data is no longer transferred from pin 330 to pin 340. When the programming data is being transmitted from the programming apparatus, if the next device in the chain is the targeted FPGA device, the P_en signal from pin 370 will put the device in programming mode and the device will be programmed according to the programming data received from pin 340.

Thus, the invention obviates the need to use resistors to transfer programming information from an upstream ASIC device to downstream FPGA devices. This greatly reduces the complexity associated with the prior method since the board onto which the devices are mounted need not be designed with resistor pads. Hence, any one of the FPGA devices can be replaced by an ASIC device anywhere on the board without changing the bill of materials for the board.

Figure 1:
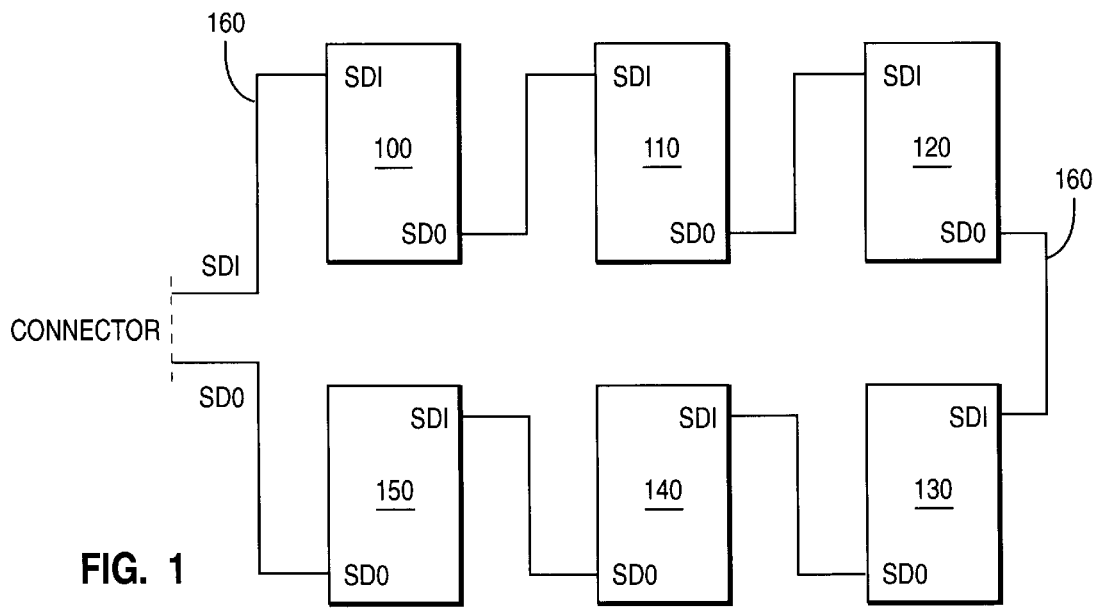
FIG. 1 depicts an electronic system modeled with FPGA devices.
Figure 2:
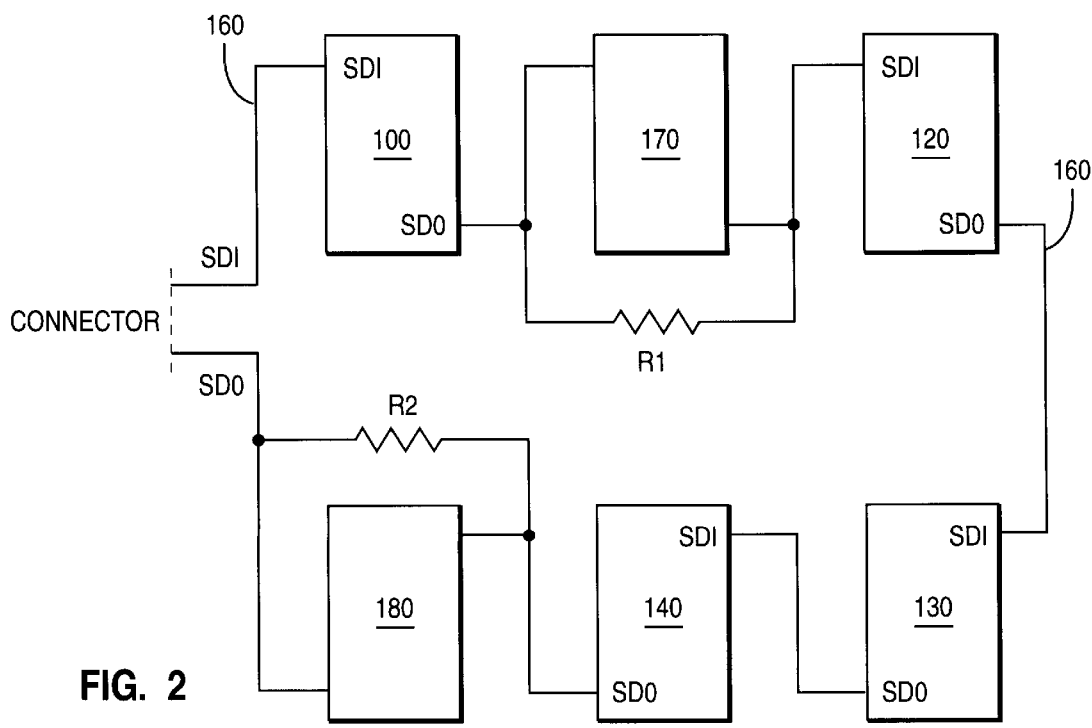
FIG. 2 depicts an electronic system modeled with both FPGA and ASIC devices.

The following presents a further implementation of the invention. In order not to have to reroute the programming bus 160, when an ASIC device replaces an FPGA device, pins 330 and 340 of the ASIC device must be at the same locations as the SDI and SDO pins of the FPGA device (see devices 170 and 180 of FIG. 2). To decrease the pin count in FPGA devices, often times, the SDI and SDO pins are multiplexed with two standard I/O pins. If an ASIC device is replacing an FPGA device that had its SDI and SDO pins multiplexed with two I/O pins, the ASIC device must have pins 330 and 340 multiplexed with the same two I/O pins. Otherwise, regular data that would have been received at the SDI pin (in this case, pin 330) may not be received by the ASIC device and data from pin 340 may not be transmitted from the ASIC device.

Figure 4:
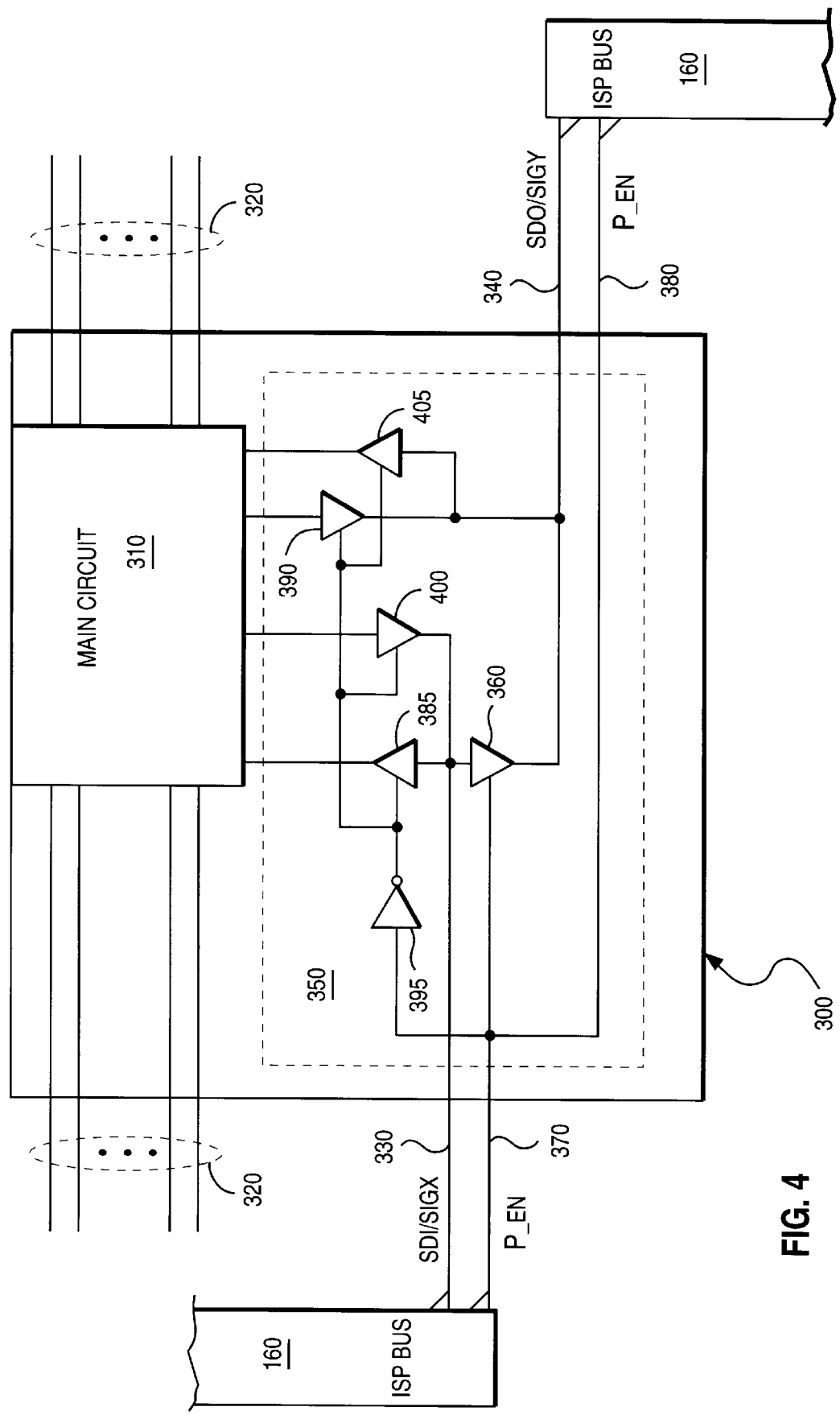
FIG. 4 depicts an ASIC device incorporating the present invention and having multiplexed pins.

FIG. 4 depicts an ASIC chip incorporating the present invention and having pins 330 and 340 multiplexed with two of the standard I/O pins 320. In this case, PPI 350 contains five tri-state buffers, buffers 360, 385, 390, 400 and 405 and an inverter 395. The input of buffers 360 and 385 as well as the output of buffer 400 are connected to pin 330. The output of each of the buffers 360 and 390 and the input of buffer 405 are connected to pin 340 wherein the output of buffers 385 and 405 as well as the input of buffers 390 and 400 are connected to the main circuit 310. As in FIG. 3, the programming signal P_en on pin 370 activates the buffer 360. However, the programming signal P_en is inverted by inverter 395 before driving buffers 385, 390, 400 and 405.

In operation, when programming data is being received by the ASIC device 300, buffer 360 is activated by the programming signal P_en. Therefore, the programming data received on pin 330 is transmitted out on pin 340. Buffers 385, 390, 400 and 405 will be deactivated since they all receive the inverse of the programming signal. Consequently, main circuit 310 will not receive or transmit data on pins 330 and 340. When regular data, sigx and sigy, are being received or transmitted on pins 330 and 340, buffer 360 will not be activated as the programming signal P_en will not be asserted. However, buffers 385, 390, 400 and 405 will be activated by the inverse of the programming signal P_en. Hence, sigx will either be received on pin 330 through buffer 385 or transmitted using buffer 400 on pin 330. Equally, sigy will either be received using buffer 405 or transmitted through buffer 390 on pin 340.

Although the present invention has been fully described above with reference to specific embodiments, other alternative embodiments will be apparent to those of ordinary skill in the art. Therefore, the above description should not be taken as limiting the scope of the present invention defined by the appended claims.

What is claimed is:

1. An application specific integrated circuit, (ASIC), having a plurality of first input/output (I/O) means comprising:

a means for receiving and transmitting programming data;

a first buffer means having second I/O means, said first buffer means being a tri-state buffer for temporarily storing said programming data, said first buffer means being activated by a programming signal for transmitting said programming data via said second output means; and means for multiplexing said second I/O means with said first I/O means.

2. The application specific integrated circuit of claim 1 wherein said multiplexing means includes a second and third buffer means having third and fourth input and output means, respectively, said third input means of said second buffer and said fourth output means of said third buffer being connected to said second input means of said first buffer, said third output means of said second buffer and said fourth input means of said third buffer being connected to said a main circuit in said ASIC, said second and third buffers being activated by an inverted signal of said programming signal.

3. The application specific integrated circuit of claim 2 wherein said multiplexing means further includes a fourth and fifth buffers having a fifth and sixth input and output means, said fifth output means of said fourth buffer and said sixth input means of said fifth buffer being connected to said second output means of said first buffer, said fifth input means of said fourth buffer and said sixth output means of said fifth buffer being connected to said main circuit, said second buffer being activated by said inverted programming signal.

4. A method of transferring programming data from an application specific integrated circuit (ASIC), said ASIC having at least one input for receiving data and one output for transmitting data, said method comprising the steps of:

receiving said programming data into said application specific integrated circuit;

storing said programming data into a buffer; and using a programming signal for activating said buffer for transferring said programming data, said buffer having an input for receiving and an output for transmitting said programming data; and multiplexing said buffer input with said at least one ASIC input and said buffer output with said at least one ASIC output.

* * * * *